United States Patent
Hujsak et al.

(10) Patent No.: US 11,056,314 B2
(45) Date of Patent: Jul. 6, 2021

(54) METHOD FOR ACQUIRING INTENTIONALLY LIMITED DATA AND THE MACHINE LEARNING APPROACH TO RECONSTRUCT IT

(71) Applicant: NORTHWESTERN UNIVERSITY, Evanston, IL (US)

(72) Inventors: Karl A. Hujsak, Evanston, IL (US); Vinayak P. Dravid, Evanston, IL (US); Benjamin D. Myers, Evanston, IL (US)

(73) Assignee: Northwestern University, Evanston, IL (US)

( * ) Notice: Subject to any disclaimer, the term of this patent is extended or adjusted under 35 U.S.C. 154(b) by 311 days.

(21) Appl. No.: 15/332,573

(22) Filed: Oct. 24, 2016

(65) Prior Publication Data

US 2017/0213355 A1    Jul. 27, 2017

Related U.S. Application Data

(60) Provisional application No. 62/286,721, filed on Jan. 25, 2016, provisional application No. 62/245,039, filed on Oct. 22, 2015.

(51) Int. Cl.
*H01J 37/22* (2006.01)
*G06T 5/00* (2006.01)

(52) U.S. Cl.
CPC .......... *H01J 37/222* (2013.01); *G06T 5/005* (2013.01); *G06T 2207/10061* (2013.01); *G06T 2207/20081* (2013.01)

(58) Field of Classification Search
CPC .............................. H01J 37/222; G06T 5/005
See application file for complete search history.

(56) References Cited

U.S. PATENT DOCUMENTS

| | | | | |
|---|---|---|---|---|
| 2014/0103225 A1* | 4/2014 | Kieft | ....................... | H01J 37/28 250/440.11 |
| 2014/0300726 A1* | 10/2014 | Gladnick | .............. | G06T 3/4069 348/86 |
| 2015/0069233 A1* | 3/2015 | Anderson | ............. | H01J 37/222 250/307 |
| 2015/0187073 A1* | 7/2015 | Stemmer | ................. | G06T 5/001 382/131 |

OTHER PUBLICATIONS

Hyrum S. Anderson, Jovana Ilic-Helms, Brandon Rohrer, Jason Wheeler, Kurt Larson } "Sparse imaging for fast electron microscopy", Proc. SPIE 8657, Computational Imaging XI, 86570C (Feb. 14, 2013); doi: 10.1117/12.2008313; https://doi.org/10.1117/12.2008313 (Year: 2013).*

* cited by examiner

*Primary Examiner* — Jamie J Atala
*Assistant Examiner* — Hesham K Abouzahra
(74) *Attorney, Agent, or Firm* — Bell & Manning, LLC

(57) ABSTRACT

Aspects of the present disclosure involve a data capturing and processing system that intentionally captures data and/or data sets with missing pieces of information. The data and/or datasets may include various types of data, such as one-dimensional signals, two-dimensional images (or other images), and/or three-dimensional structures. The captured data is processed to restore missing information into the data and/or data sets, thereby enabling simultaneous pattern recognition and image recovery.

16 Claims, 19 Drawing Sheets

Sampling Mask Quality Metrics

| Scan Mask | Yeast PSNR (dB) | Yeast Cross-Corr. | Fracture PSNR (dB) | Fracture Cross Corr. | Diatom PSNR (dB) | Diatom Cross Corr. |
|---|---|---|---|---|---|---|
| Random | 36.2385 | 0.9925 | 30.3347 | 0.9887 | 27.6446 | 0.9828 |
| Lines | 35.5779 | 0.9913 | 29.7491 | 0.9871 | 26.691 | 0.9785 |
| Lissajous | 35.8769 | 0.9919 | 29.9661 | 0.9877 | 27.441 | 0.9818 |
| Spiral | 36.4263 | 0.9928 | 30.2601 | 0.9884 | 27.5393 | 0.9823 |

FIG. 1G

FIG. 3A
FIG. 3B
FIG. 3C
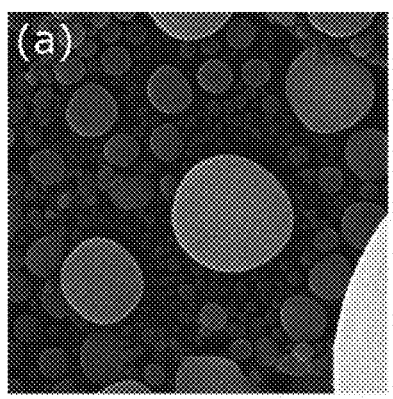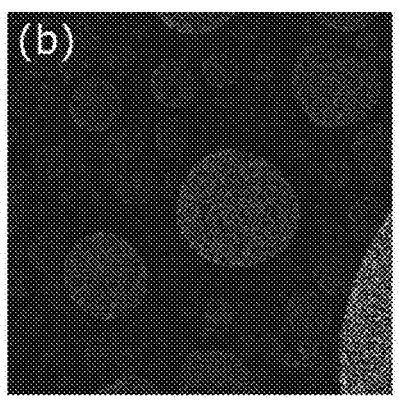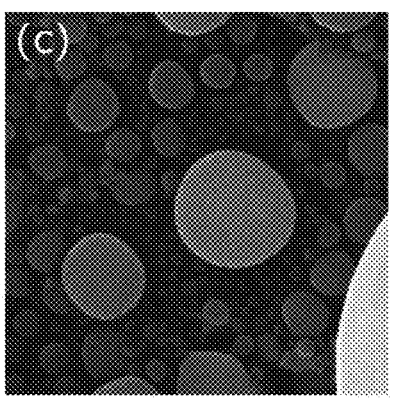
FIG. 3D
FIG. 3E
FIG. 3F
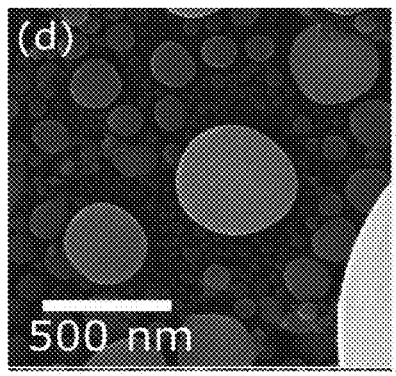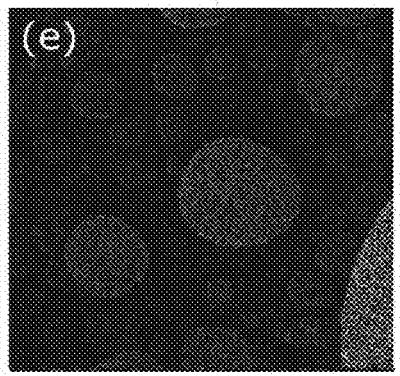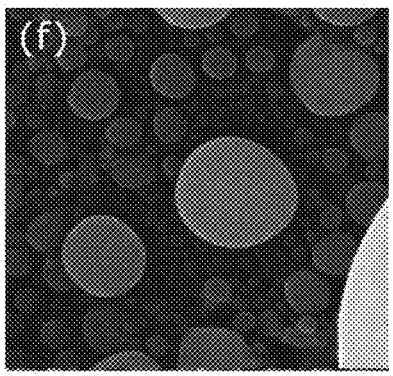

FIG. 5A
FIG. 5B
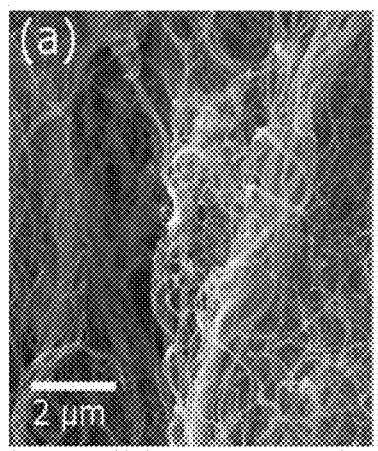
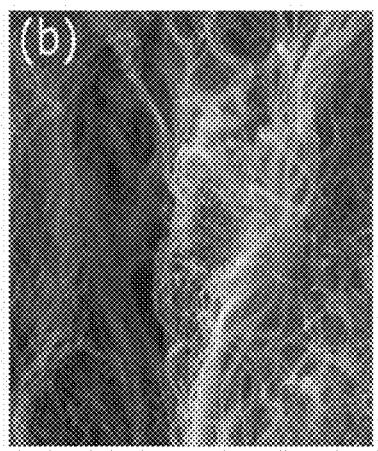
FIG. 5C
FIG. 5D
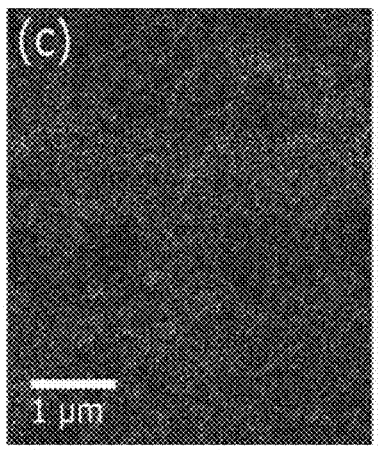
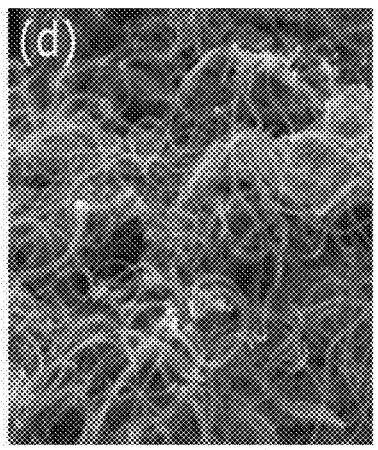

FIG. 6A
FIG. 6B
FIG. 6C
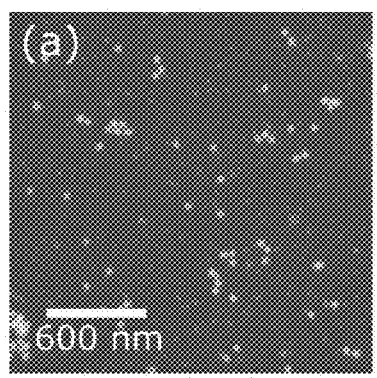
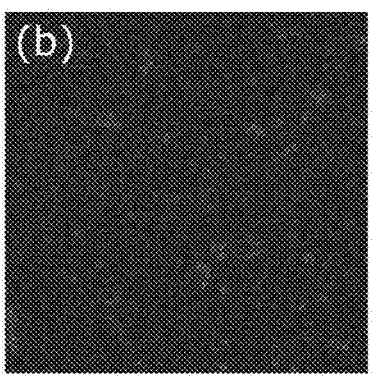
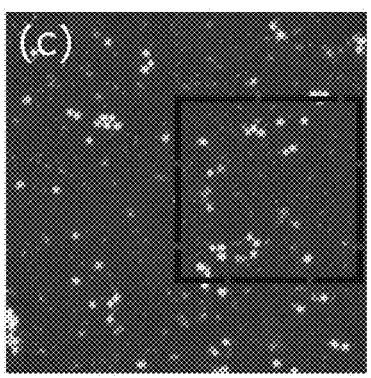
FIG. 6D
FIG. 6E
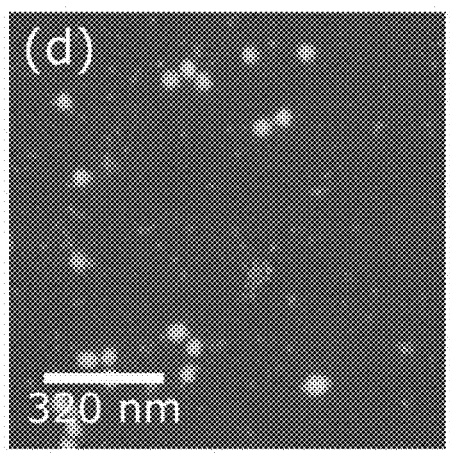
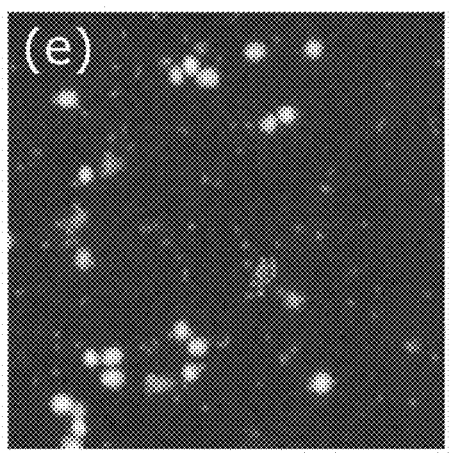

FIG. 8B        FIG. 8C
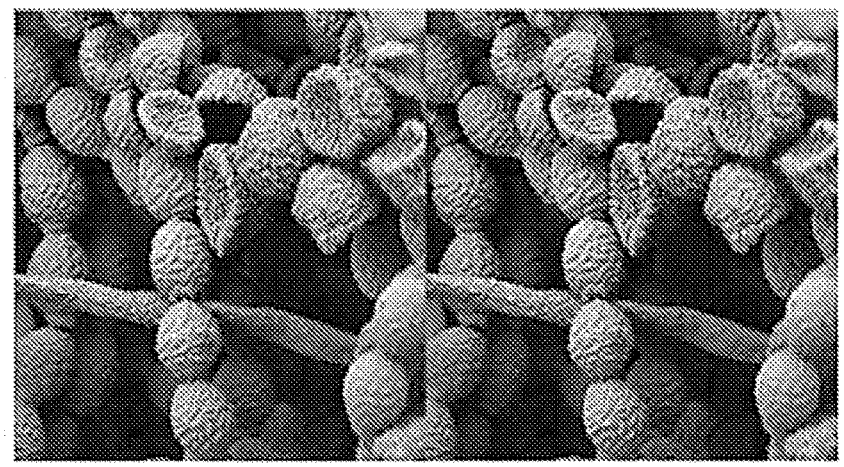
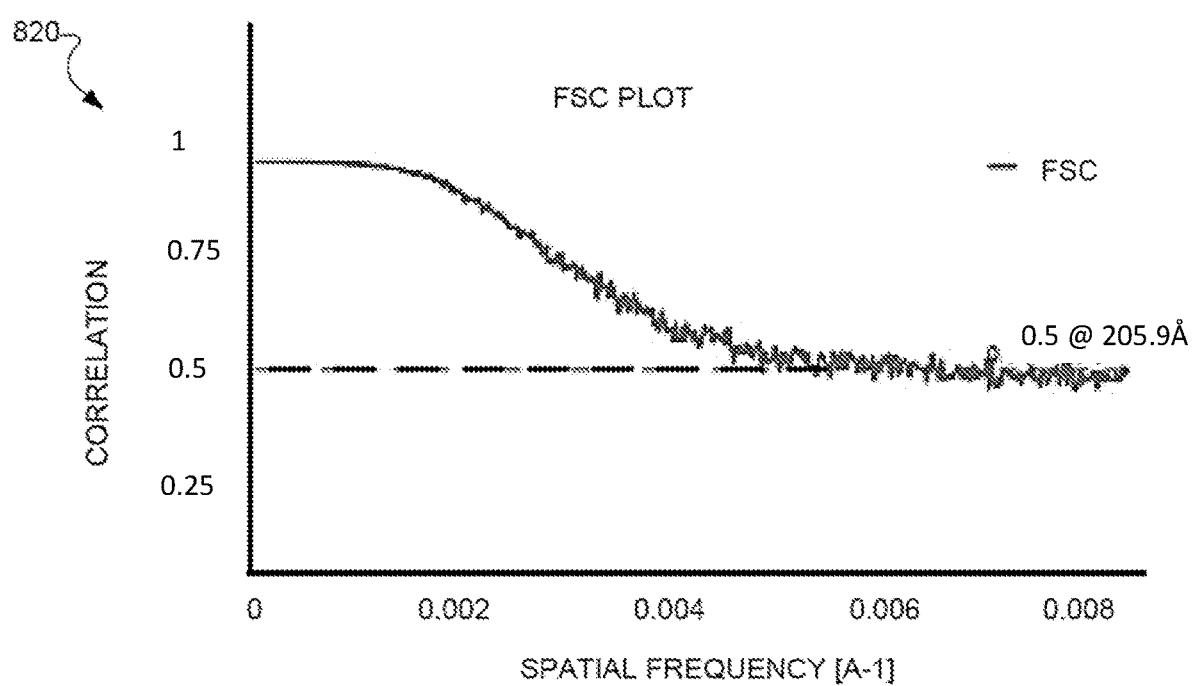
FIG. 8D

METHOD FOR ACQUIRING INTENTIONALLY LIMITED DATA AND THE MACHINE LEARNING APPROACH TO RECONSTRUCT IT

CROSS REFERENCE TO RELATED APPLICATION

The present non-provisional application claims priority under 35 U.S.C. § 119 to U.S. Provisional Application No. 62/245,039 entitled, "Systems And Methods For Intentionally Limited Data And The Machine Learning Approach To Reconstruct It," filed on Oct. 22, 2015, and which is hereby incorporated by reference in its entirety. The present non-provisional application also claims priority under 35 U.S.C. § 119 to U.S. Provisional Application No. 62/286,721 entitled, "A Method For Acquiring Intentionally Limited Data And The Machine Learning Approach To Reconstruct It," filed on Jan. 25, 2016, and which is hereby incorporated by reference in its entirety.

STATEMENT REGARDING FEDERALLY-SPONSORED RESEARCH

The present application/invention was made with government support under DGE1324585 awarded by the National Science Foundation and FA9550-12-1-0280 awarded by the Air Force Office of Scientific Research. The government has certain rights in the invention.

TECHNICAL FIELD

Aspects of the present disclosure relate to electron microscopy and image processing, and in particular, the processing of image data generated via electron microscopy devices using machine learning algorithms.

BACKGROUND

Often times, when capturing information, such as a one-dimensional signal, a two-dimensional image, and/or a three-dimensional structure, noise and other deleterious interactions associated with the devices employed to capture the information may result in missing pieces of the information and/or incomplete information being captured. For example, electron microscope devices are used in neuroscience, microbiology, and materials science for high-resolution imaging and subsequent structural and/or compositional analysis. A scanning electron microscope ("SEM") uses a focused beam of high-energy electrons to generate a variety of signals at the surface of a sample specimen and ultimately capture a series of images of the specimen. Deleterious interactions commonly referred to as "electron beam induced artifacts" may be generated by an SEM during the image capturing process. And the amount of artifacts generated is typically impacted by the amount of energy and the quantity of the incident electrons generated by the SEM. Thus, the quality of the images is directly related to the competing influences of high energy electron flux and deleterious electron sample interactions, which are a function of both the specimen's structure and the incident energy from the focused electron beam.

Typical methodologies for dealing with such deleterious interactions and incomplete information require a recapturing of the data, which is both time-consuming and expensive. Other methodologies, such as "Compressive Sensing" rely on 'projection-type' measurements, which are limited in application and require expensive hardware modifications to leverage.

It is with these problems in mind, among others, that various aspects of the present disclosure were conceived.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

FIGS. 1A-1G provide illustrations of reconstructing images, according to aspects of the present disclosure.

FIGS. 3A-3F provide yet other illustrations of reconstructing images, according to aspects of the present disclosure.

FIGS. 5A-5F provide yet other illustrations of reconstructing images, according to aspects of the present disclosure.

FIGS. 6A-6E provide yet illustrations of reconstructing images, according to aspects of the present disclosure.

FIGS. 8A-8D illustrate a method for evaluating the resolution of a reconstructed image, according to aspects of the present disclosure.

DETAILED DESCRIPTION

Aspects of the present disclosure involve a data capturing and processing system that automatically and intentionally captures (e.g., under-sample) incomplete data and/or data sets with missing pieces of information. The incomplete data and/or datasets may include various types of data, such as one-dimensional signals, two-dimensional images (or other images), and/or three-dimensional structures. Once the incomplete data and/or datasets have been captured, the data is processed via one or more statistical machine learning algorithms that employ latent feature detection (not directly observable) to "in-paint" missing information into the incomplete data and/or data sets, thereby enabling simultaneous pattern recognition and image recovery. Generally speaking, in-painting is the process of reconstructing lost, deteriorated, or incomplete parts of images and videos. In the context of an image (e.g., a digital image) with incomplete and/or missing pieces of information, the disclosed system executes one or more statistical machine learning algorithms that automatically replace the lost, missing, and/or corrupted portions of the image data.

In one particular embodiment, the systems and methods disclosed herein may be applied in the context of electron microscopy. More specifically, and as will be described in more detail below, the incomplete data and/or datasets may be captured using an SEM that uses a beam of accelerated electrons as a source of illumination to generate micrographs of a sample specimen (e.g., biological and/or inorganic specimens). Stated differently, SEMs represent a specific type of microscope that uses a beam of electrons to create an image of a given sample or specimen.

Figure 1:
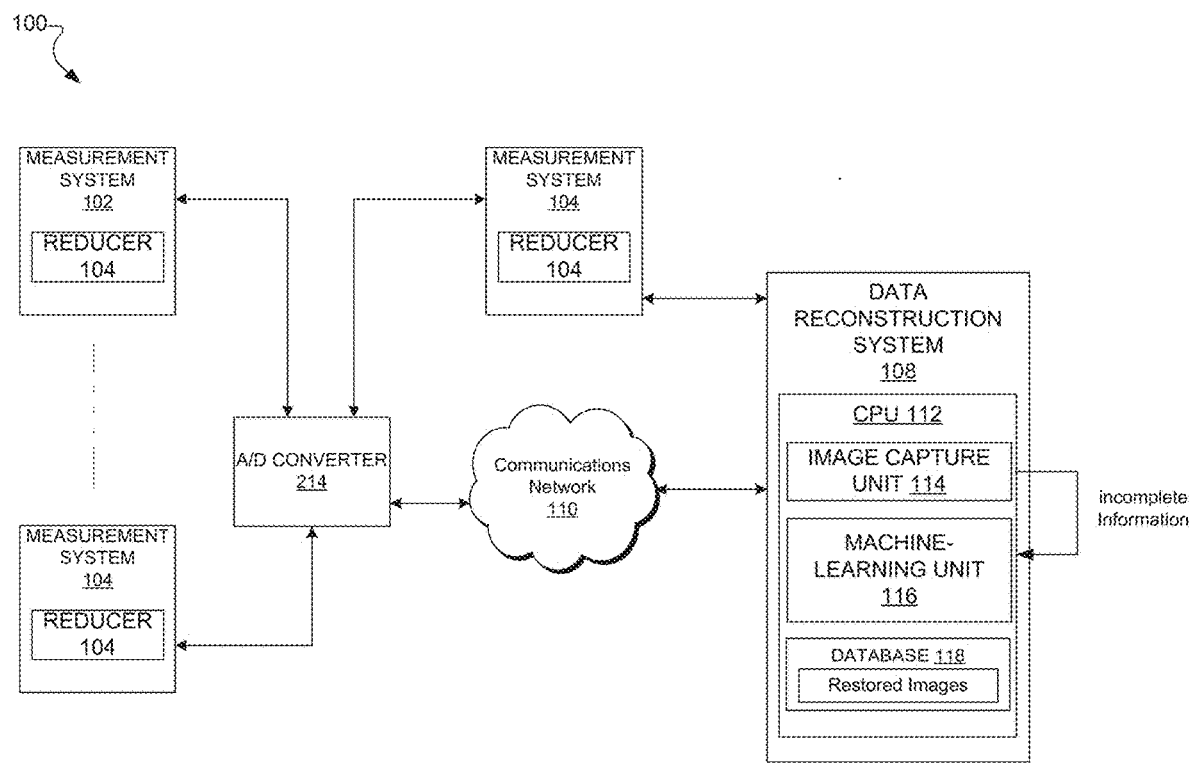
FIG. 1 is a block diagram illustrating a computing architecture, according to aspects of the present disclosure.

FIG. 1 illustrates an example computing architecture 100 comprising one or more measurement systems 102-106 and a data reconstruction system 108, all of which may be deployed with the computing architecture 100 to capture incomplete data and automatically execute various statistical machine learning algorithms that employ in-painting techniques to identify latent-features from the incomplete data, thereby enabling simultaneous image recovery and pattern recognition. The one or more measurement systems 102-106 and the data reconstruction system 108 may be functionally and communicatively connected via a communications network 110, which may be an IP-based telecommunications network, the Internet, an intranet, a local area network, a wireless local network, a content distribution network, or any other type of communications network, as well as combinations of networks. Alternatively, the one or more measurement systems 102 and the data reconstruction system 108 may be functionally and communicatively connected according to a local arrangement, in which such devices directly interact with one another, such as via a hardline or wireline.

Figure 2:
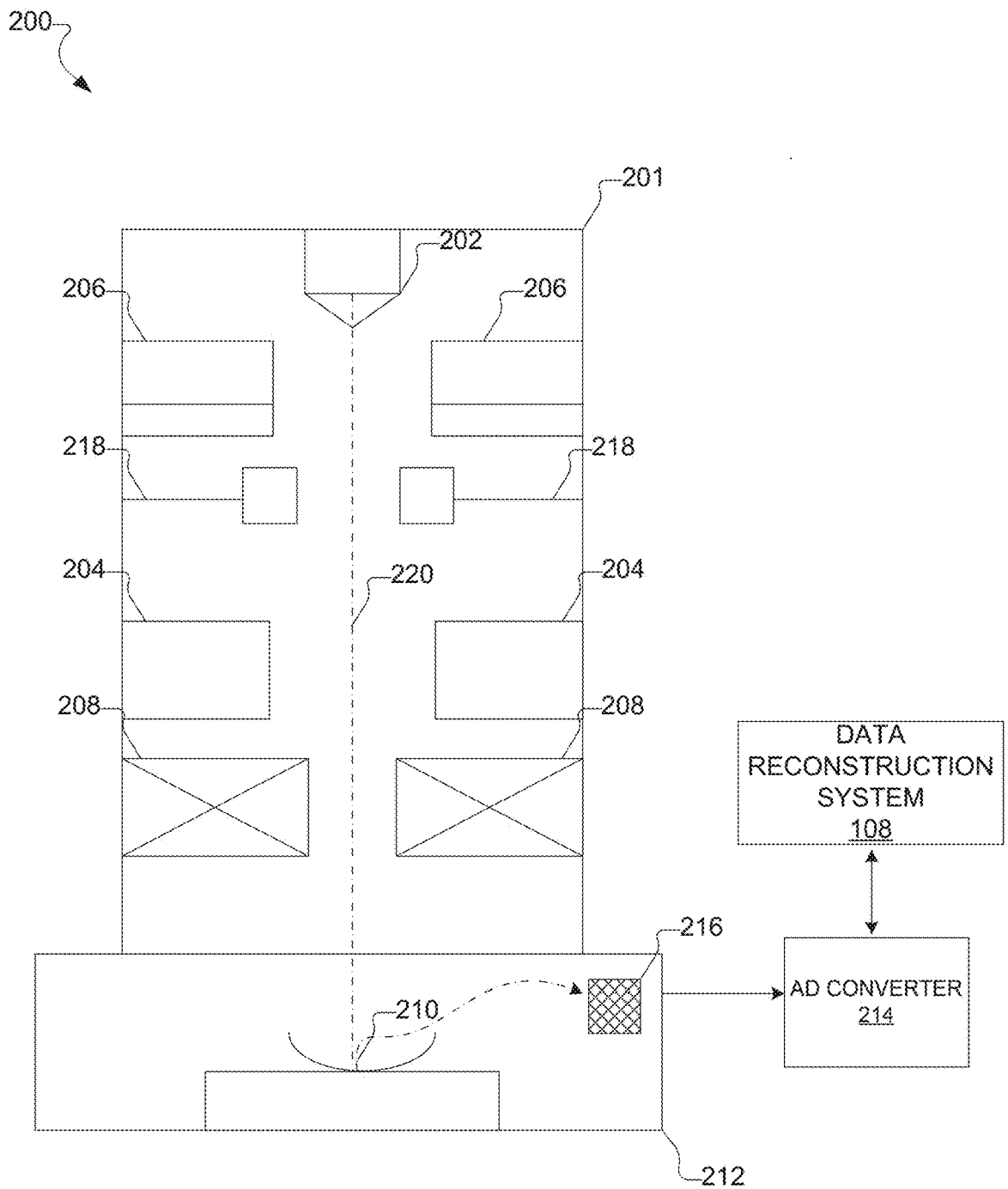
FIG. 2 is an illustration of a SEM, according to aspects of the present disclosure.

In one embodiment, each of the one or more measurement systems 102-106 may be an SEM, as illustrated in FIG. 2 at 200. Generally speaking, the SEM 200 represents a type of electron microscope that produces images of a sample specimen by scanning it with a focused beam of electrons. The electrons interact with atoms in the sample specimen, producing various signals that may be detected and that contain information about the sample's surface topography and composition. The sample specimen is scanned in a raster scan pattern, and the beam's position is combined with the detected signal to produce an image. In the illustrated embodiment, the SEM 200—enclosed within a vacuum chamber 201—includes an electron gun 202, a deflecting coil 204, and a condenser lens 206 and an objective lens 208, which focuses a primary electron beam 220 emitted from the electron gun 201 and illuminates a sample specimen 210 with the beam. The sample specimen 210 is included within a sample chamber 212. In some embodiments, the SEM 200 may also include a A/D converter 214 that converts an image signal detected by a secondary electron detector 216 into a digital image signal, which in turn, may be transmitted to the data reconstruction system 108.

Referring again to FIG. 1, a reducer system 104 may be employed in each of the one or more measurement systems 102-106 to reduce the amount of energy provided by the one or more measurement systems 102-106 when generating images. Stated differently, the reducer system 104 is a mechanism, component, device, and/or the like, that defects the beam generated by the one or more measurement systems 102-106. In one embodiment and with reference to FIG. 2, the SEM 200 may be operatively connect to, or otherwise include, a reducer system in the form of a high-speed electrostatic beam blanker 218. The high-speed beam blanker 218 is intended to blank/unblank a beam of electrons generated and/or otherwise provided by the SEM 200, according to an on/off control mechanism that is synchronized with the scanning of the electron beam from the electron gun 202.

In one embodiment, the beam blinker 218 may include a deflector formed by two electrodes and downstream of said deflector a diaphragm with an aperture. The diaphragm intercepts the beam of electrons when the beam is deflected by a deflector, and the aperture transmits the beam when the beam is not or hardly deflected. While the above example refers to a beam blanker, it is contemplated the reducer system may involve other types of devices and systems, such as a masking material and corresponding control system, a physical beam stopper, and/or the like.

In another embodiment, the SEM 200 and the reducer system 106 may be a Quanta 600F scanning electron microscope with a Nanometer Pattern Generations Systems ("NPGS") beam control system (collectively referred to herein as the "Quanta Scanning Example"). The lithography system integrates two 16 bit digital-to-analog converters ("DAC") to control beam position, an analog-to-digital (ADC) converter to collect the imaging signal and a high-speed electrostatic beam blanker. The NPGS digital imaging feature may be modified to perform an "unfair coin toss" process to select the sampled pixels given a user selected percentage. The image may be acquired in a standard raster scan and the beam may be blanked at those pixel locations determined to be un-sampled. In this way, the raw 16 bit output from the ADC may be stored for 'on' pixels and a value of zero stored for 'off' pixels. The dwell time of the 'on' pixels, as well as the resolution and magnification of the image may be user selectable, or preset.

Referring again generally to FIG. 1, the data reconstruction system 106, to which the one or more measurement system 102 and the reducer system 104 are connected, includes a CPU 112. The CPU 112 includes an image capturing unit 114 that captures incomplete and/or intentionally under-sampled images generated by the one or more measurement systems 102. The CPU 116 also includes a machine-learning unit 116 that executes one or more statistical machine learning algorithms that employ in-painting techniques to identify latent-features from the incomplete images captured by the image capturing unit 114. In some embodiments, the data reconstruction system 108 may include a database 118 for storing and retrieving the latent features. Although the database 118 of FIG. 1 is depicted as being located within the data reconstruction system 108, it is contemplated that the database 118 may be located external to the data reconstruction system 108, such as at a remote location, and may communicate with the data reconstruction system 108 via the communications network 110.

Although the previous embodiments refers to electron microscopy and/or SEMs, it is contemplated that systems and methods described herein may be used in other fields, and further, may be applied to or otherwise used in conjunction with other types of measurement devices in which incomplete data and/or information (e.g., images) may be captured serially, such as any model of a Scanning Electron Microscope, a Scanning Transmission Electron Microscope, or a Scanning Probe Microscope, x-ray scans at airport and many other such security areas, medical imaging, PET, CT, tomography; military imaging, scouting for targets, etc., among others. Example embodiments of the application of various aspects of the present disclosure in the context of electron microscopy will now be provided.

PART I: Imaging Dose Sensitive Nanomaterials: Bayesian Dictionary Learning and Compressive Sensing with Electrons Electron microscopy of biological, polymeric, and other beam-sensitive structures is often hampered by deleterious electron beam interactions. In fact, the imaging of such beam-sensitive materials may be limited by the allowable radiation dosage rather than the capabilities of the microscope (or other capturing device) itself, the effects of which have been compounded by the availability of high brightness electron sources. Reducing dwell times to overcome dose-related artifacts, such as radiolysis and electrostatic charging, is challenging because of the inherently low contrast involved in imaging such materials. These challenges are particularly exacerbated during dynamic and time-resolved, fluidic-cell imaging, or 3-D tomographic reconstruction—all of which undergo additional dosage. Thus, there is a pressing need to produce high quality images at low electron doses. Aspects of the present disclosure disclose a system, including a commercial scanning electron microscope with an electrostatic beam blanker, that directly reduces and suppresses beam induced artifacts through under-sampling pixels, by as much as 80% reduction in dosage, and subsequently employs a dictionary learning "in-painting" algorithm to reconstruct the missing portions of the images. Doing so, allows for multiple sparse recoverable images to be acquired at the cost of one fully sampled image.

Dictionary learning techniques such as the Beta Process Factor Analysis Algorithm ("BPFA") have demonstrated state of the art image recovery from under-sampled images by exploiting the sparsity of natural signals. Direct dose reduction and suppression of beam induced artifacts through under-sampling pixels, may result in direct dose reduction and suppression of beam induced artifacts by, for example, 80% although lower and higher percentages may be achieved. The reduction in electron exposure allows for multiple sparse images to be acquired at the cost of one fully sampled image (or better), with the random and sparse images reconstructed using a BPFA algorithm. Such methods may be applied to fragile nano-scale and micro-scale materials, as well as in situ experiments in liquid environments, achieving high-quality images by simultaneously de-noising and in-painting low signal-to-noise ratio images.

In some embodiments, a high-speed electrostatic beam blanker is employed to achieve a scanning "mask" in which certain pixels are un-sampled by deflecting the electron beam away from the sample. Doing so allows for the design of scanning masks that may not be feasible through direct beam control due to limitations of the scan coils, while being more easily implementable on many microscopes. The effectiveness of this approach is demonstrated in reducing electron dose and suppressing dose related artifacts on a variety of samples. For example and in one embodiment, several simulations were run on a variety of biological and material samples with complicated structures to determine the most appropriate sampling mask for general imaging. The peak signal to noise ratio (PSNR) of reconstructions from several different simulated scan patterns was examined on a variety of fully sampled images collected from an SEM. These scan patterns include those generated from trigonometric function (Spiral and Lissajous) as well as simply subsampling horizontal lines from the image, modeling a coarse raster scan.

Figure 1A:
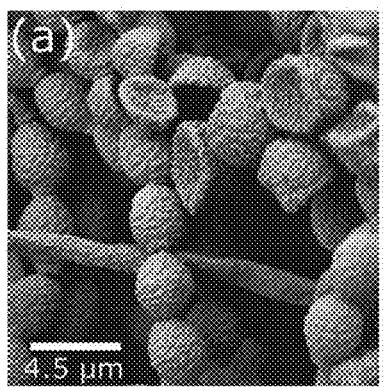
Figure 1B:
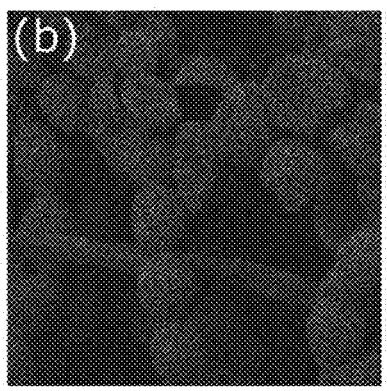
Figure 1C:
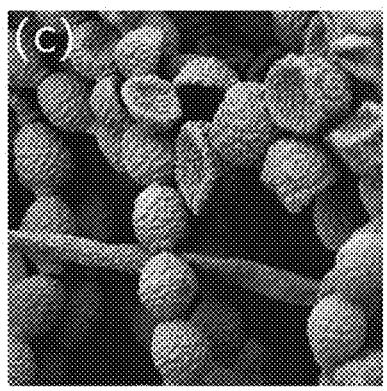
Figure 1D:
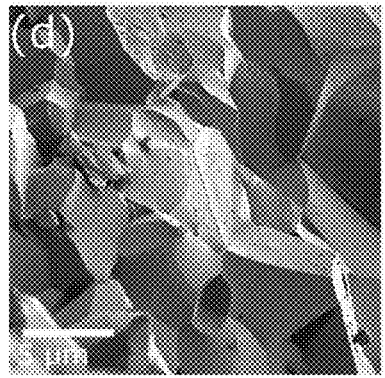
Figure 1E:
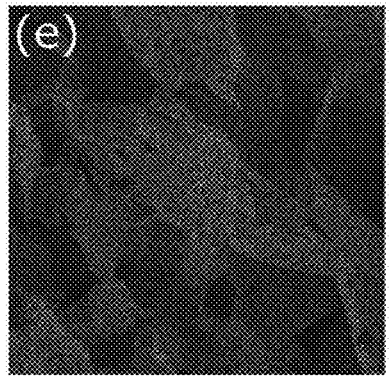
Figure 1F:
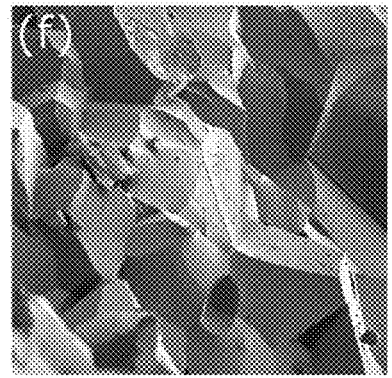

FIGS. 1A-1G provide example simulations of reconstructing images with varying sampling masks. In particular, sampling for all masks was performed with 30% of the total pixels physically sampled. FIG. 1A illustrates a fully sampled image of yeast cells and FIG. 1B illustrates a random scanning mask applied with the reconstructed image in FIG. 1C(c). FIGS. 1D-1F correspond to reconstructed randomly sampled image of a steel fracture surface. FIG. 1G provides the final image used in the quantitative analysis of the scan patterns of two diatom structures. FIG. 1G illustrates a metrics table 150 describing quality metrics for several different simulated sampling patterns demonstrating that random under-sampling generally achieves the highest quality for the majority of images.

Seen above in FIG. 1A, random sampling frequently achieves the highest quality metric on all but one sample (where it reconstructs with the second highest quality). An additional advantage of random sub-sampling is that it may be easy to construct scanning masks composed of mutually exclusive pixels, i.e., at 30% sampling three images in which no pixels are sampled more than once may be generated.

In some embodiments, several geometrically diverse, complicated and heterogeneous samples with minimal beam sensitivity were selected to experimentally examine the quality of the reconstruction against a fully sampled image. Varying sampling percentages were collected with different dwell times to examine the dual effect of noise and under-sampling on the reconstructed image.

Figure 2A:
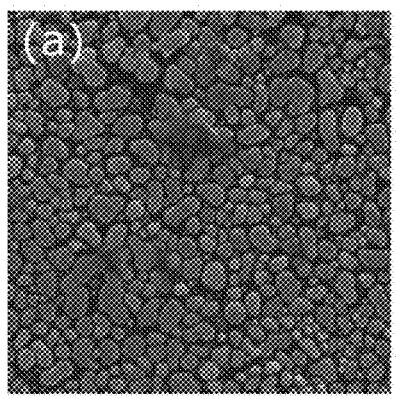
FIGS. 2A-2F provide other illustrations of reconstructing images, according to aspects of the present disclosure.
Figure 2B:
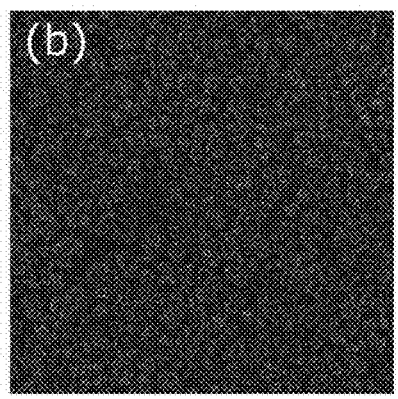
Figure 2C:
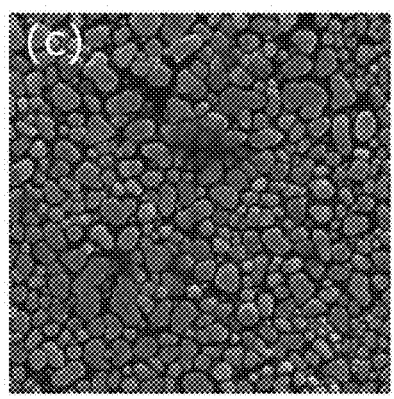
Figure 2D:
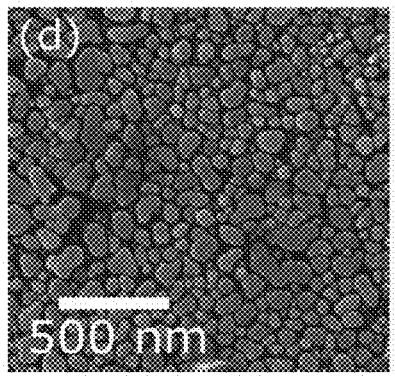
Figure 2E:
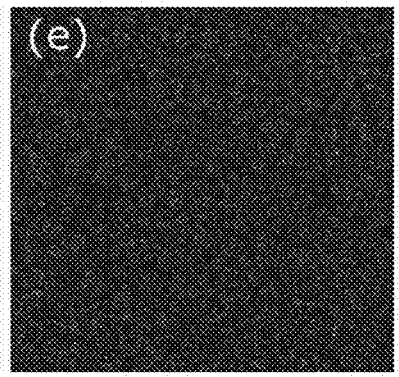
Figure 2F:
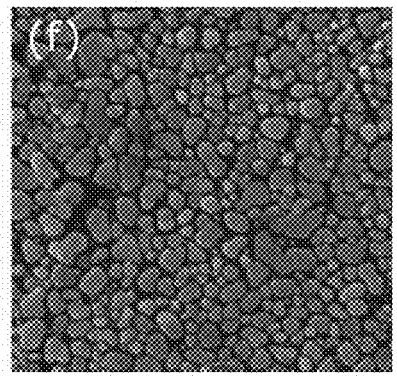

FIGS. 2A-2F illustrate both sparse and full images captured at 30 kV and 283 pA beam current. More specifically, FIG. 2A illustrates a fully sampled image of gold nano-islands on a carbon substrate collected at a dwell time of 5 μs (area dose of 1424 $e^-/nm^2$). FIG. 2B provides a 30% sparsely sampled image with a pixel dwell time of 5 μs (427 $e^-/nm^2$). FIG. 2C includes a reconstructed sparse imaging pattern of the sample area imaged in A. FIG. 2D illustrates another fully sampled image of a different region of the same sample with a 25 μs dwell time (7120 $e^-/nm^2$). FIG. 2E illustrates a sparsely collected image with only 20% of the total pixels collected (1424 $e^-/nm^2$). FIG. 2F illustrates a reconstructed sparse image of the same sample area as imaged in FIG. 2D.

A dense collection of gold nano-islands prepared on a carbon substrate was selected as the first sample. As seen in FIGS. 2A-2F, short dwell times can often result in noisy and blurry images due to Poisson-like noise. This can be seen by comparing fully sampled images FIGS. 2A-2B, where the longer dwell time results in sharper and cleaner features. The middle panels (FIGS. 2B and 2E) show the raw output of the sparse imaging process from the microscope, where the naked eye has great difficulty resolving the structure of the gold nano-islands due to heavy under-sampling. However, the reconstructions in the right panels from 30% and 20% sampling rates, respectively, show strong correlation with the fully sampled images. Complicated features are well reconstructed and a strong majority of point features are maintained, while simultaneous de-noising can often ameliorate the presence of Poisson-like noise at low exposures. It is particularly interesting to note that the effective area dose in FIG. 2F is effectively the same as in 2A, as the area dose is calculated as dose per pixel multiplied by total number of pixels and the pixel area.

FIGS. 3A-3F illustrate another embodiment of images captured at 30 kV and 283 pA beam current. In particular, FIG. 3A provides a fully sampled image of tin nanoparticles of various diameters collected at a dwell time of 5 microseconds (area dose of 1234 $e^-/nm^2$). FIG. 3B illustrates sparsely sampled (30%) image with a pixel dwell time of 5 microseconds (370.2 $e^-/nm^2$). FIG. 3C illustrates reconstructed sparse imaging pattern of the sample area imaged in (a). FIG. 3D illustrates a second fully sampled image of the same area with a 25 micosecond dwell time (6170 e⁻/nm²). FIG. 3E illustrates sparsely collected image with 30% of the total pixels collected (1851 e⁻/nm²). FIG. 3F illustrates reconstructed sparse image of the same sample area as imaged in FIG. 3D.

Next, tin nanoparticles prepared on a silicon substrate were selected to validate the sparse imaging methodology for samples with a similar array of geometric shapes, but highly heterogeneous sizes and shapes. FIGS. 4(a)-4(f) shows the results of the full and sparse imaging processes, as well as the final reconstructions from the BPFA algorithm. Similar to the gold nano-island example, high quality reconstructions were obtained for sampling as low as 30%.

Figure 4A:
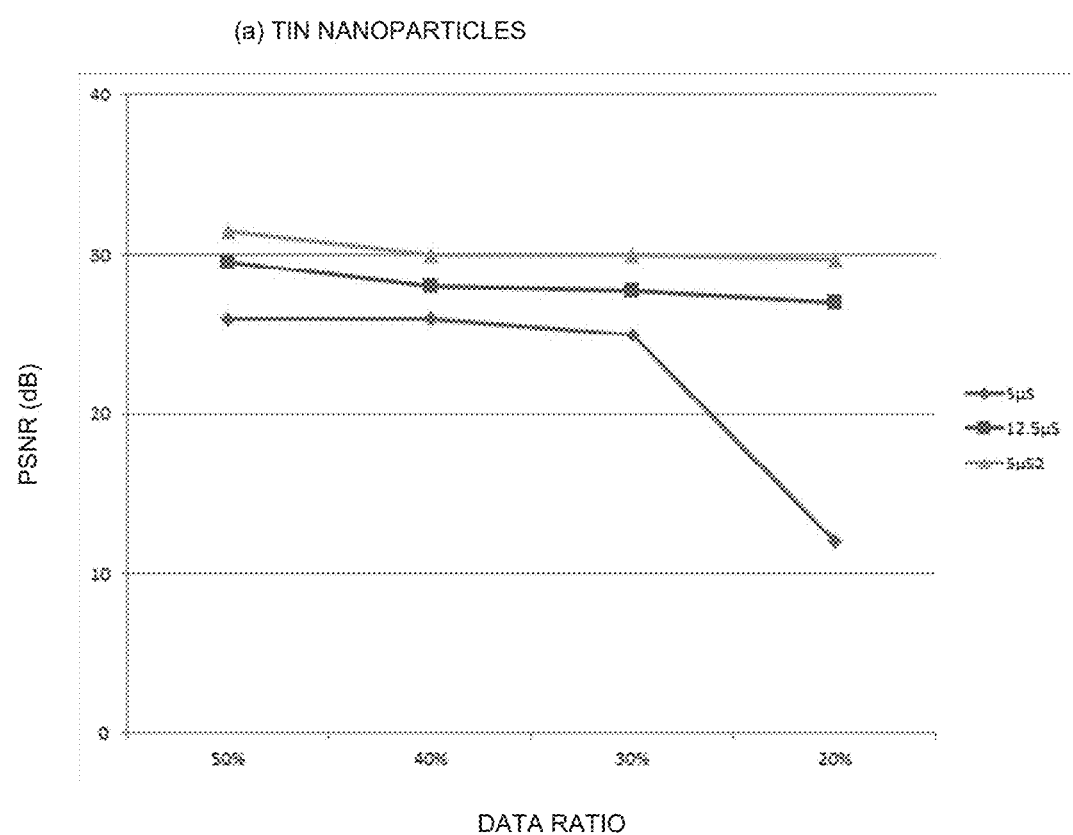
FIGS. 4($a$)-4($f$) provide charts of cross-correlation coefficients, according to aspects of the present disclosure.
Figure 4B:
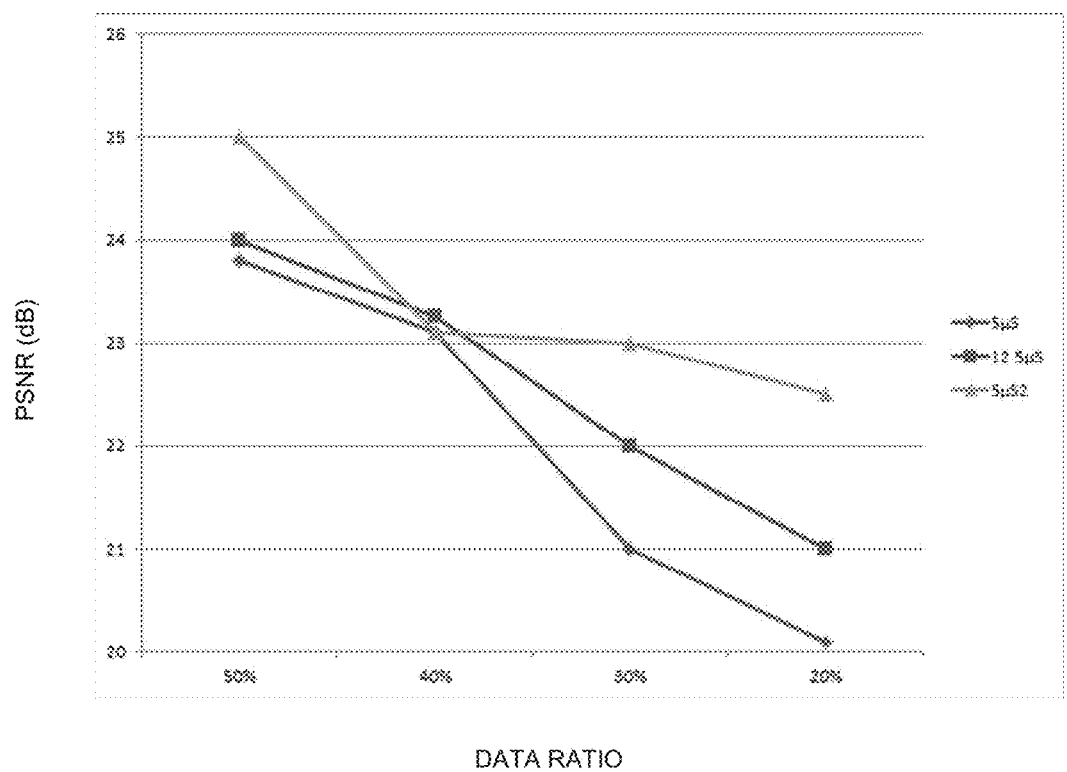
Figure 4C:
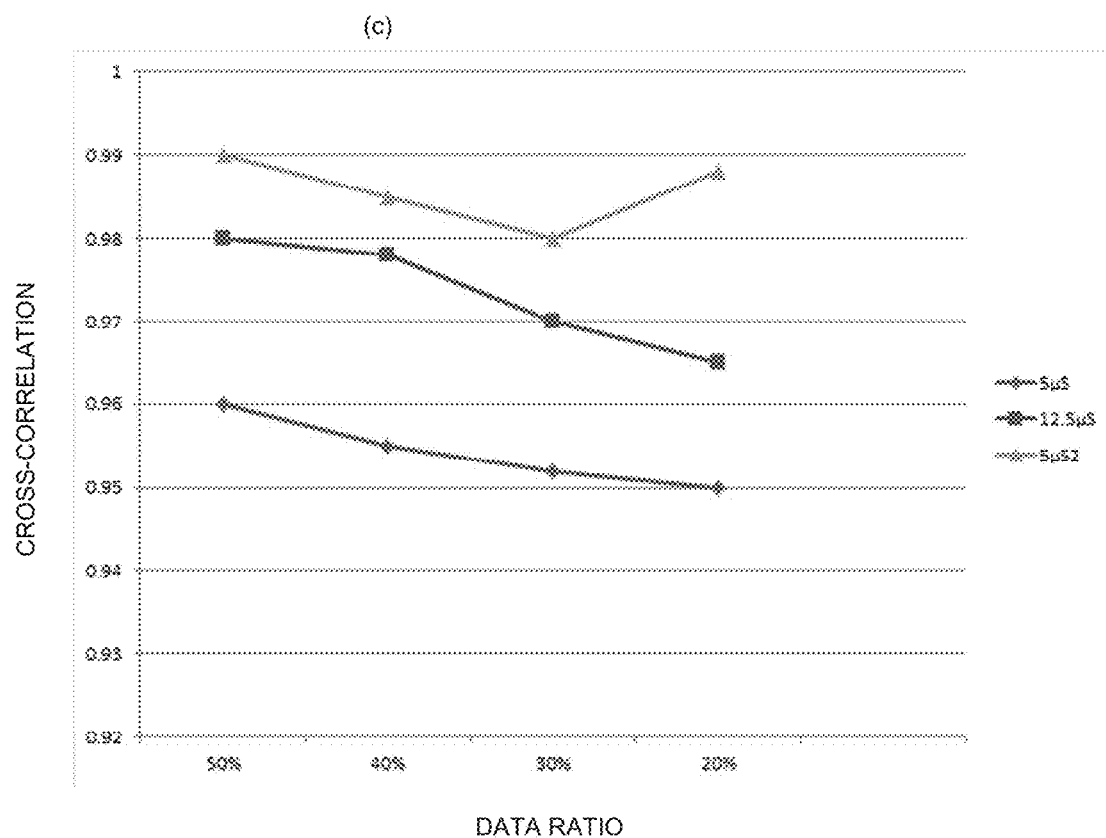
Figure 4D:
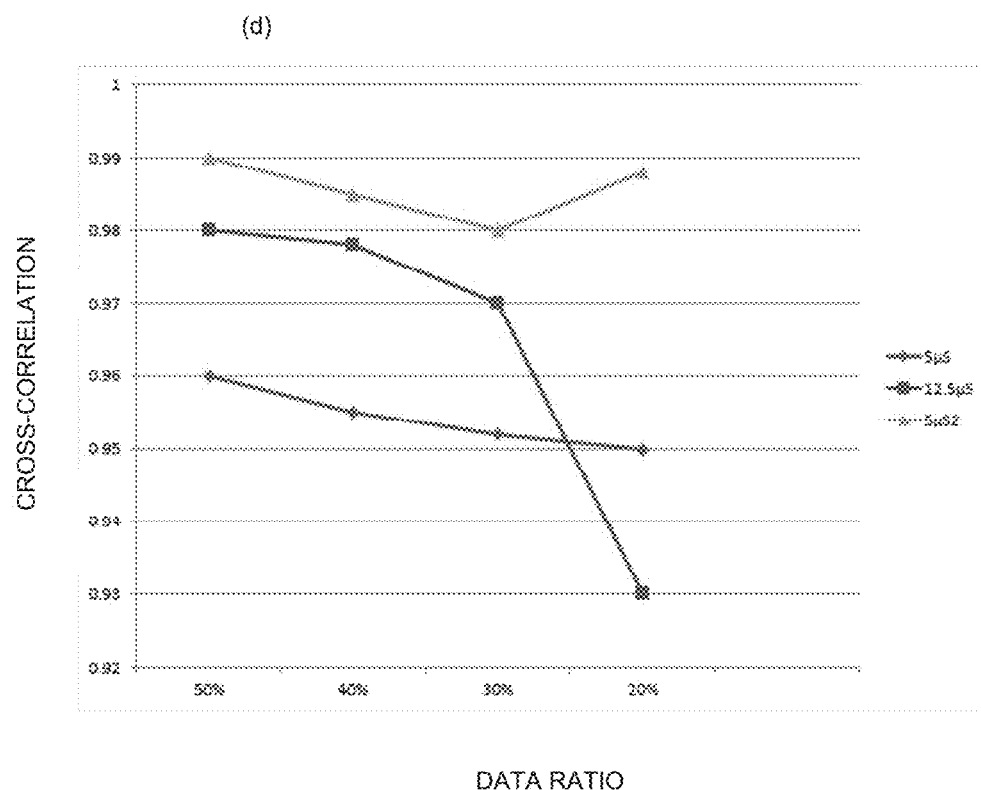
Figure 4E:
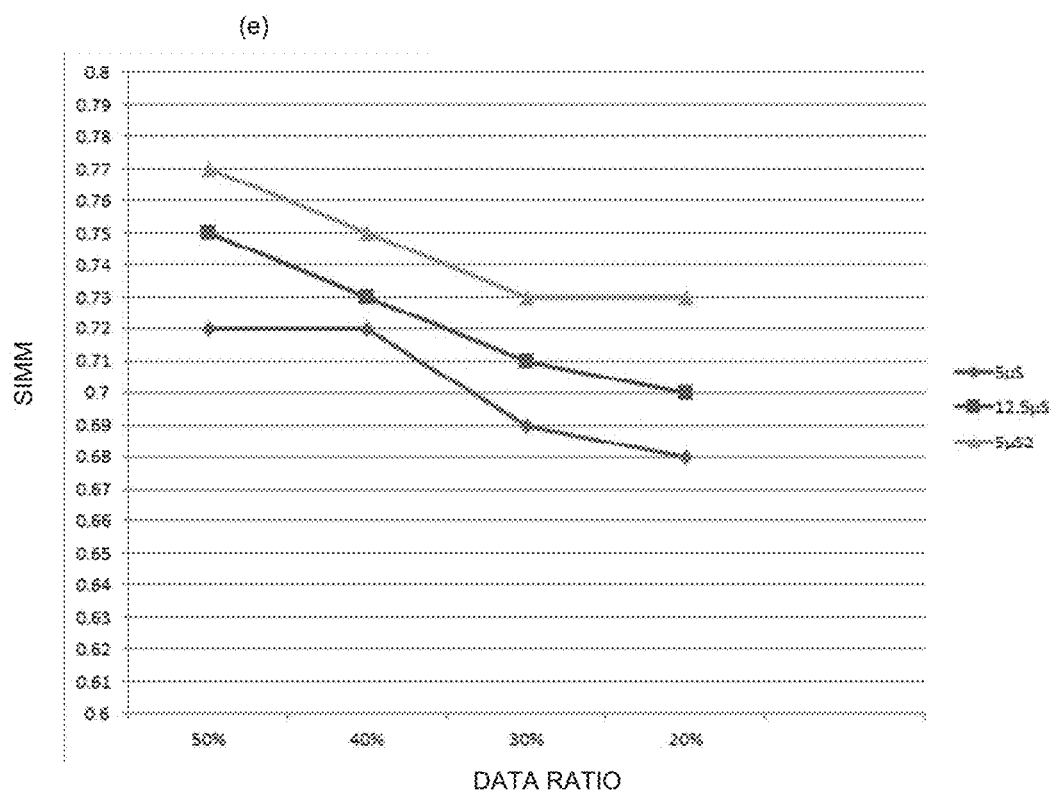
Figure 4F:
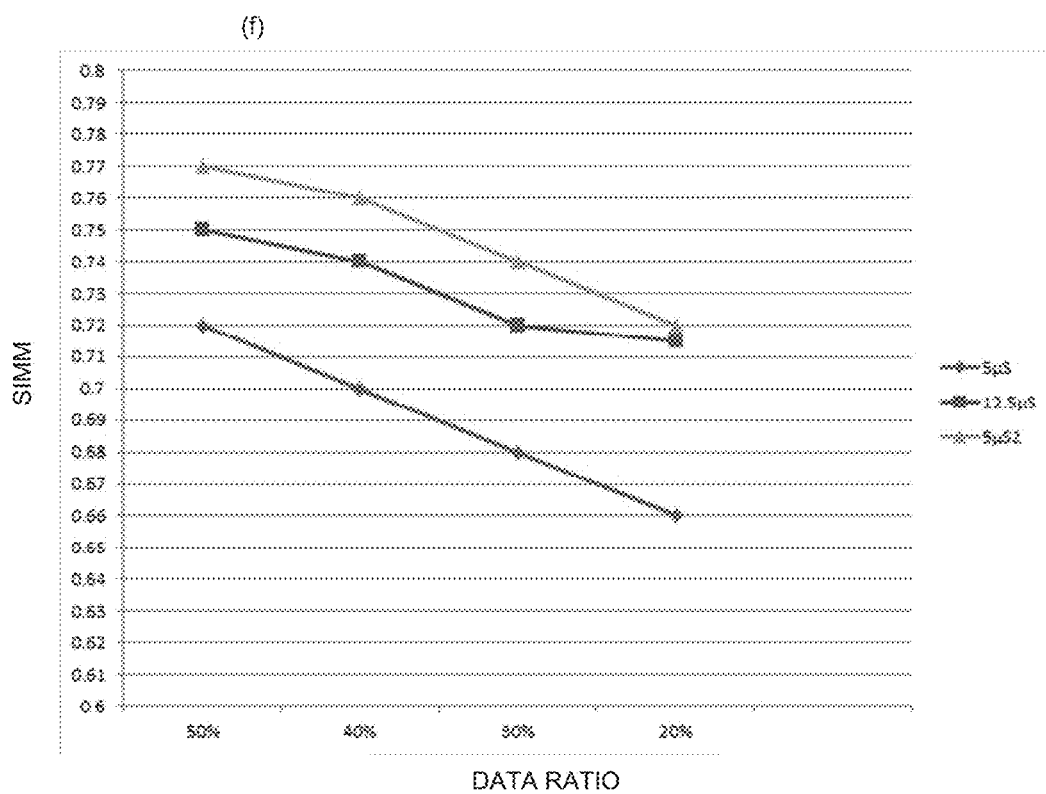

As illustrated in FIGS. 4(a),4(c), and 4(e) the peak signal-to-noise ratio (PSNR), cross correlation coefficients, and structural similarity index measures (SSIM) for the sparse imaging and reconstruction process on the tin nanoparticle sample with various dwell times and data sampling ratios. There is no strong drop of quantitative measures of image quality, even at extremely low sampling rates. FIGS. 4(b),4(d), and 4(f) PSNR, cross correlation, and SSIM results for the sparse imaging process on the gold nano-island process shows a slight dip in PSNR with decreasing data ratios as to be expected for slightly lower contrast samples. Cross correlation coefficients often vary less than 5% between reconstructions and fully sampled images, showing reconstructions are highly similar with fully sampled images.

In some embodiments, sparse imaging through the use of the PSNR and cross correlation coefficients were examined, as illustrated in Figure D. For the tin nanoparticle sample there is no obvious drop in PSNR or cross correlation, measuring the similarity of the fully sampled and sparsely sampled images, even down to 20% sampling. Therefore, even at 20% sampling, five images for the same overall dose of a comparable fully sampled image may be recorded.

Based on such understandings, several biological nanomaterials that are highly susceptible to drift and shrinkage due to electrostatic charging and radiolysis were examined. A sample of human collagen (fibril diameter~100 nm) was used due to its tendency to drift and move under the electron beam, which compromises several quantitative analyses for use in subsequent applications of these structures. Observing the distribution of collagen in joints and other isolated areas of the human body may identify the injury and healing process in areas that are highly limited blood flow. In addition, it has been shown that the performance of hybrid collagen based tissue scaffolds is highly dependent on collagen alignment and the resulting mechanical anisotrop. Therefore, the ability to image such collagen fibrils without altering their sensitive structure would increase the speed and the quantification of treatment efficacy in cartilaginous structures. The collagen was obtained from a human patient, then immediately placed in fixative and processed with Osmium tetroxide and dehydrated with ethanol followed by critical point drying. The sample was then mounted to an SEM stub with silver paint and coated with 5 nm of Osmium in a plasma osmium coater prior to imaging.

Figure 5E:
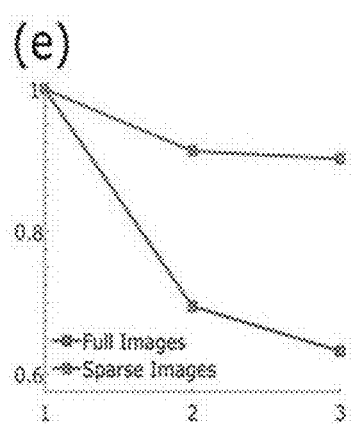
Figure 5F:
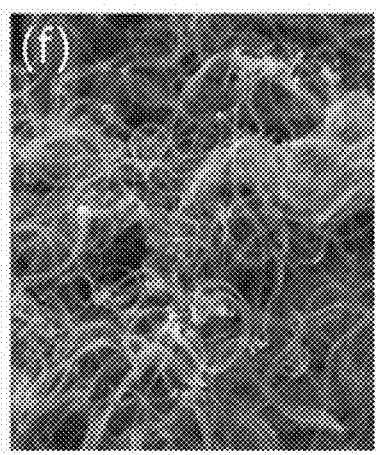

FIG. 5 illustrates another embodiment of images sampled and/or otherwise captured at 30 kV with 48.2 pA beam current with a full image area dose of 20.45 e⁻/nm² and a sparse image area dose of 6.135 e⁻/nm² FIG. 5A illustrates a fully sampled image of human collagen prepared on carbon tape. FIG. 5B illustrates a second fully sampled image overlaid on the original image showing large distortion and sample movement due to beam sample interactions, with differences highlighted with green and purple. FIG. 5C illustrates raw sparse image on the same sample collected at 30% sampling rate. FIG. 5D illustrates the reconstruction of the under-sampled data with the BPFA algorithm. FIG. 5E illustrates the cross correlation vs. three sequences of images captured using 100% sampling and 30% sparse sampling. A very strong reduction in similarity between fully sampled images is observed, while sparse images maintain high similarity due to strong reduction in electron dose and corresponding dose induced artifacts. FIG. 5A illustrates the differences between the first and third sparse image are highlighted with green and purple and show significantly reduced beam induced sample alteration compared to FIG. 5B.

As seen in FIG. 5, although SEM(s) can produce high quality micrographs of complicated collagen distributions, multiple images can result in substantial changes to the native collagen architecture. The overlaid images in Figure Eb show just how significant this sample distortion can be between just two exposures. Sections highlighted with green and purple are areas of the first and second image, respectively, which do not match when overlaid due to electrostatically induced sample drift. The drift associated with individual fibrils under the electron beam in 5b can be more than 400% their diameter (>450 nm translation for a fibril diameter of 100 nm). On the other hand, sparse imaging can produce images of similar quality with only 30% sampling rates. Figure Ee quantitatively demonstrates this "three for the price of one" effect, as the similarity between three fully sampled images diverges quite quickly due to the extreme beam sensitivity of the sample. However, the cross correlation for the three subsequent sparse images is effectively constant, demonstrating the direct dose reduction. In the case of the sparse images, only one low-mag full sampled image was captured prior to imaging sparsely to rule out the formation of a polymerized hydrocarbon film in reducing sample movement.

Samples for in situ fluidic cell microscopy were prepared by first thermally evaporating 2 nm of Cr followed by 8 nm of Au on custom fabricated MEMS chips with electron transparent silicon nitride membrane windows. Thiolated DNA oligonucleotides were then attached to the gold surface and used to immobilize DNA functionalized gold nanoparticles through complementary DNA binding interactions. The nanoparticle coated chips were then mounted over a reservoir containing a buffer solution (0.5 M NaCl, 0.01 sodium phosphate, pH=7.4) and loaded into a custom built SEM liquid cell holder that will be described in detail in a forthcoming manuscript. Imaging was carried out using an accelerating voltage of 25 kV and a solid-state backscattered electron (BSE) detector.

FIGS. 6A-6E illustrate a fully sampled secondary electron (SE) image of 80 nm and 30 nm gold nanoparticles immersed in water on a porous gold substrate, according to one embodiment. FIG. 1B illustrates a sparse 30% sampled experimental image collected for reconstruction of the same sample. FIG. 1B illustrates the reconstruction of the sparsely sampled image showing strong similarity and dramatically reduced background noise as compared with FIG. 6A. FIG. 1D illustrates a zoomed in image of the inset in FIG. 1C highlighting the noise present in most SE images in liquid environments. FIG. 1E illustrates the same inset from the reconstruction which was experimentally collected after the fully sampled image. The highlighted region displays nanoparticles that are present and observable in the sparse imaging method, that were attracted to the region when capturing fully sampled images, possibly due to a combination of electrostatic interactions and electron beam induced cross-linking of the DNA linkers. Multiple 30 nm particles are missing from the fully sampled image, and clumps of particles not resolvable in the fully sampled image due to noise are clearly distinguishable.

In situ fluidic-cell experiments have shown to be highly susceptible to dose related damage and artifacts due to the need to capture sequences of images with the fluidic medium providing samples with great mobility and potential side reactions with aqueous electrons. This is particularly important for the observations of interactions of nanoparticles and nucleation and growth or supramolecular chemical reactions, for example. Depending on the nanoparticle surface charge, electrostatic effects can cause attraction or repulsion of particles in the viewing area as well as beam induced agglomeration. In addition, unavoidable noise due to the low SNR of such experiments makes such observations challenging, particularly with BSE imaging in the SEM liquid cell. However, as shown in FIG. 5, the sparse imaging method is well suited to this problem. The sparsely imaged sample actually produces a lower noise image than the fully sampled image while all major features, including the small 30 nm nanoparticles, are retained. For the case of DNA functionalized nanoparticles, we notice that nanoparticles are attracted to the field of view under high dose irradiation. This effect is seen in the sparsely sampled image in FIG. 5E following acquisition of the fully sample image in FIG. 5D. These small particles are highly mobile and are likely "glued" to the surface during high dose imaging due to crosslinking effects. In addition, nanoparticles, which had clumped together and were not individually distinguishable due to high noise in the fully sampled image, are clearly separable in the sparse image. In this way, sparse imaging may provide the "one-two punch" needed for in situ experiments, drastic reduction of undesirable electron dose and retrieval of de-noised images.

The loss of some point-like features is unavoidable in this imaging method, due to the random method of sampling. Features only present in one pixel have a statistically small chance of being sampled by the electron beam, but one is rarely interested in pixel values that share no correlation with nearby pixels. Thus, the suppression of random 'spikey' noise is another advantage of this method, which is usually found when operating at high magnification in a noisy environment. This, again, is particularly relevant to the observation of in situ or biological samples, where spiky or line like artifacts can often obscure real information that the sparse imaging process is capable of retrieving. Generally, it appears that sampling more information does not necessarily correlate with a higher fidelity reconstruction. As shown in FIGS. 2A-2F, 3A-3F, and FIG. 4, a higher dwell time will result in better reconstruction due to the suppression of noise. Despite this, samples with feature sizes many orders larger than the pixel size minimum dwell times are generally acceptable, as seen in the gold nano-island example. For samples with many small features, such as the smallest tin nanoparticles, increasing the dwell time may be necessary in order to properly sample and reconstruct features that are captured in less than 20 pixels. In general, 30% sampling affords a quality reconstruction for a variety of dwell times and samples, while successfully suppressing many artifacts.

Figure 7:
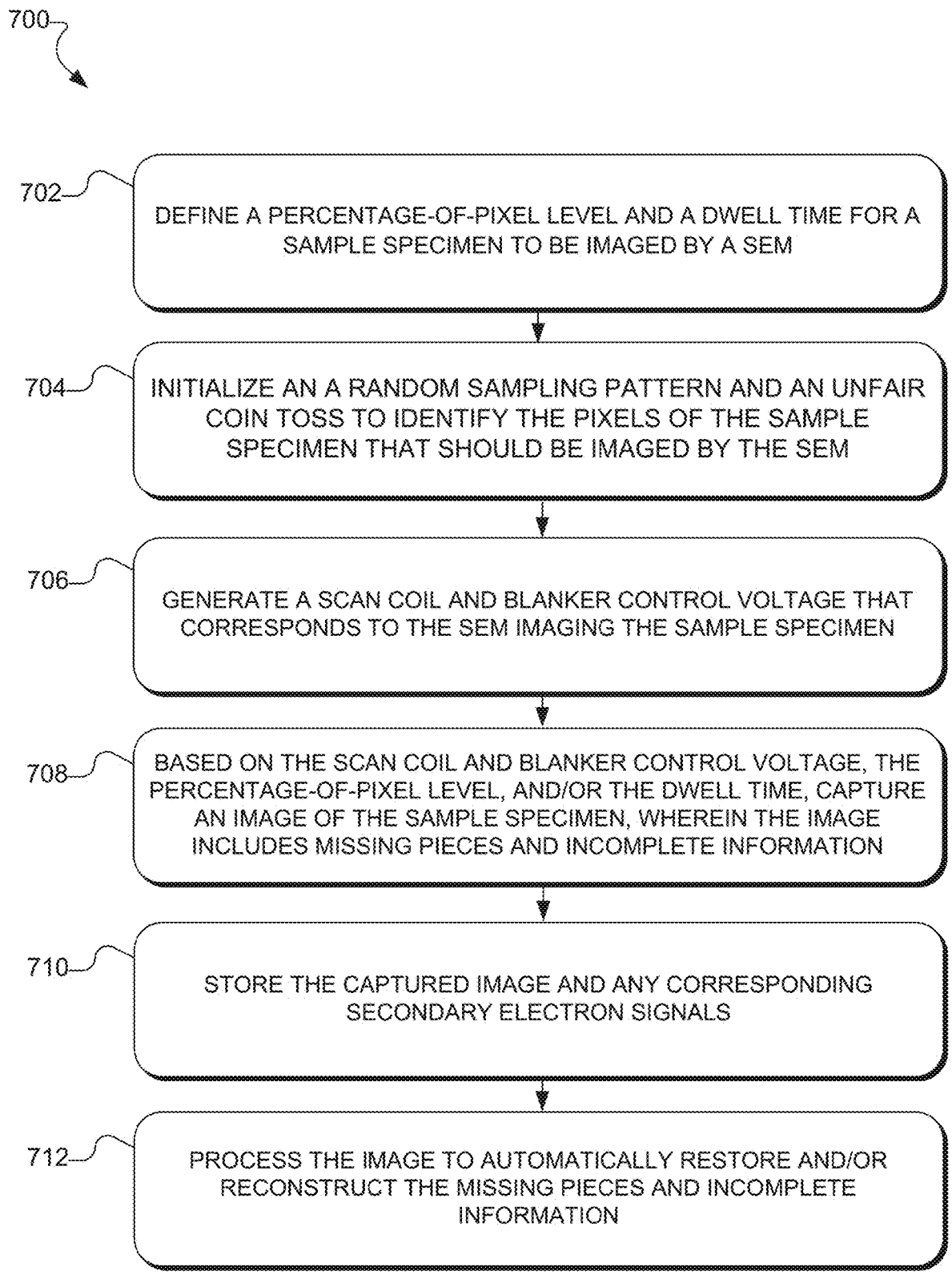
FIG. 7 is a flowchart illustrating an example process for reconstructing images, according to aspects of the present disclosure.

Referring now to FIG. 7 and with reference to FIGS. 1-2, an illustrative process 700 for capturing incomplete data and/or un-sampled data and executing various statistical machine learning algorithms that employ in-painting techniques to identify latent-features from the incomplete data, thereby enabling simultaneous image recovery and pattern recognition is provided. As illustrated, process 700 begins with defining a certain percentage of pixels, referred to herein as a "percentage-of-pixel" level, of a sample specimen that a user and/or the system would like image using an SEM (operation 702). Establishing the 'percentage-of-pixels' effectively reduces the overall area of the sample specimen being imaged, as the SEM electron beam will only interact with the defined percentage of the total number of pixels of the sample. In some embodiments, the user and/or system may also define a dwell time, which is the amount of time that the SEM electron beam will spend interacting with the sample specimen.

Once the 'percentage-of-pixels' and/or dwell time has been established, a random sampling pattern with unfair coin toss is applied or otherwise initialized to identify the specific pixels of the sample specimen that should be imaged (operation 704). Referring to FIG. 1, the image capturing unit 112 of the CPU 110 may initialize the random sampling pattern with the unfair coin toss. Additionally, in some embodiments, a scan coil and blanker control voltage may be generated that corresponds to the SEM responsible for capturing the image (operation 706). Again Referring to FIG. 1, the image capturing unit 112 of the CPU 110 may automatically define the scan coil level and/or blanker control voltage level for the SEM capturing the image of the sample specimen.

Based on the "percentage-of-pixel" level, dwell time, and/or the scan coil level and/or blanker control voltage level, one or more measuring devices (e.g., a SEM) may capture an image of the sample specimen, wherein the image is intentionally under-sampled and/or includes incomplete and missing information (operation 706). In one embodiment and referring to FIG. 1B, the SEM 200 may capture an image of the sample specimen 210. The captured image of the sample specimen 210 may, in some instances, be intentionally captured in an incomplete, sparse, and/or under-sampled manner, based on the percentage-of-pixel" level, dwell time, and/or the scan coil level and/or blanker control voltage level. Capturing images in such a manner may reduce the amount of energy exposed to the sample specimen 210, effectively reducing the amount of damage and other electron-dose related artifacts that arise during the imaging of the to the specific sample specimen.

Referring again to FIG. 7, the generated image is captured and stored, along with any secondary electron signal(s) generated during the imaging (operation 710). Generally speaking, secondary electron signal(s) represent the electrons released as the electron beam passes through the final aperture. Typically, secondary electrons do not contribute any information about the sample specimen; instead, secondary electrons contribute additional noise and background signal which reduces the contrast range available. From the sampled specimen itself, there are two sources which contribute information about the specimen: the secondary electron signal released by the surface interaction of the incident primary electron beam and the secondary electron signal released as the back-scattered electrons pass out of the specimen. Referring to FIG. 1, the image capturing unit 112 of the CPU 110 may automatically capture and store the generated raw image of the samples specimen, along with any secondary electron signals.

Referring again to FIG. 7, the captured image is processed to automatically restore and/or otherwise reconstruct the missing portions (operation 712). Referring again to FIG. 1, the image capturing unit 112 of the data reconstruction system 106 obtains the image generated by the one or more measuring systems 102 (e.g., the scanning electron microscope 102B), which transmits the image to the machine-learning unit 114 that executes one or more statistical machine learning algorithms to reconstruct the incomplete image.

In one particular embodiment, dictionary learning and weights are applied to the captured images and image patches are generated. Then, the secondary electron signal are provided to a Beta Process Factor Analysis Algorithm ("BFPA algorithm") to replace any missing pixels of the image with learned latent features stored in the dictionary. An illustrative example of dictionary learning based on electron microscopy images of sample specimens will now be provided. The example will be explained according to the Quanta Scanning Example described above.

Example: Imaging Dose Sensitive Nanomaterials: Bayesian Dictionary Learning and Compressive Sensing with Electrons Consider the capture of an M×N pixel image, where the intensity at each m×n array element corresponds to a pixel location. Generally, this matrix is stored through a basis transformation (from real space to discrete cosine or wavelet) under which the information is 'K'-sparse, meaning it requires only K coefficients to accurately restore the image under the inverse transform (generally K<<M×N). Most signals, although not necessarily explicitly 'sparse' are often highly compressible, where many coefficients are small and may be discarded without affecting the quality of the signal. Generally, this compression process can be reversed such that the measurement is performed on a compressed form of the signal, resulting in sparse projection measurements. This process can be described as follows:

$$v_i = \Phi_i \psi_i x_i$$

Where $v_i$ represents the compressed measurement, $\Phi_i$ is the matrix representing the measurement or sampling process, $\psi_i$ is the sparsifying transform, and is the original signal of interest. After collection, $x_i$ is reconstructed from $v_i$ offline utilizing an appropriate choice of algorithm (usually framed as a convex minimization problem). Sample pixels in an image were then randomly sampled and a measurement matrix was generated, equal to a large identity matrix with the diagonal elements equal to one for sampled pixels, and zero for un-sampled pixels.

Dictionary learning algorithms seek to find an accurate representation of data given the multiplication of a dictionary matrix D by corresponding dictionary weights, α. An analogy is an Indian Buffet, where each customer entering the restaurant selects a dish from the buffet with a poisson like probability distribution generated by a Beta-Bernoulli process. As additional customers enter the restaurant, the probability that they select a dish is further updated by the number of previous customers who selected the dish against the probability of selecting a new dish. Any dish that remains untasted after all customers have been served is removed from the menu, and thus the appropriate number of dishes needed is learned iteratively. Thus, each missing image patch selects learned features, with appropriate weights given the weighting matrix, from a dictionary whose size and character is sampled from the observed pixels in the image. This is an example of nonparametric Bayesian learning where the sampling process in the BPFA algorithm is performed by Gibbs iterations.

Mathematically, the dictionary learning process can be extended to the terminology of compressive sensing with the following equation: $v_i = \Phi_i D_i \alpha_i + \epsilon_i$, where $\Phi$ maps the true pixel values ($x_i \approx D_i \alpha_i$) to the sparsely measured pixels $v_i$ with an error term given by $\epsilon_i$. Where the dictionary D and its corresponding weight matrix α linearly combine to reconstruct the true image x as illustrated by the following equation:

$$x \approx d_1 \alpha_1 + d_2 \alpha_2 + d_3 \alpha_3 + \ldots d_k \alpha\_k$$

Practically, in the BPFA algorithm implementation, the image is divided up into patches in which the dictionary features and weights are learned iteratively. In this way, one pixel may be covered by many patches forming an overcomplete dictionary, the advantages of which in a data rich regime are discussed elsewhere[2]. It has also been shown that noise present in the image is often orthogonal to the learned dictionary, providing simultaneous de-noising and in-painting[3]. Sparsity in the dictionary weight matrix is enforced through the beta-bernoulli process. The full hierarchical model of the BPFA process is given below for interested readers:

$$v_i = \Phi D\alpha_i + \epsilon_i$$

$$\epsilon_i \sim N(0, \gamma_\epsilon^{-1} I_m)$$

$$D = [d_1, d_2, \ldots d_K]$$

$$d_k \sim N(0, n^{-1} I_n)$$

$$a_i = z_i * w_i$$

$$w_i \sim N(0, \gamma_w^{-1} I_k)$$

$$z_i \sim \prod_{k=1}^{K} Bernoulli(\pi_k)$$

$$\pi_k \sim beta\left[\frac{a}{K}, b\frac{(K-1)}{K}\right]$$

Another biological sample highly susceptible to drift and shrinkage due to electrostatic charging and radiolysis was also examined. The formation of bacterial colonies and biofilms on aquatic species is an useful topic in the environmental preservation life cycle of oceanic ecosystems[8]. Microbial biofilms have also been shown to induce metamorphosis in larvae of scleractinian coral in laboratory studies[9], so the observation of native morphology of bacterial colonies and biofilms on marine species, such as micro brittle starfish, may shed light on complicated marine life cycles. The micro brittle starfish was harvested from a coral reef aquaculture system and fixed with 2.5% glutaraldehyde, 4% paraformaldehyde in a saline buffer (approximate SG 1.026 or 35ppt). The samples were then postfixed with 1% Osmium Tetroxide, dehydrated in a graded series of Ethanol, and critical point dried. The processed starfish were finally mounted to the SEM stub with carbon tape and sputter coated with 5 nm of AuPd prior to imaging. The results are displayed in Figure S2.

As seen in the fully sampled images of the top most panel, multiple SEM exposures can result in spreading and movement due to electrostatic charging. Such beam induced movement may alter conclusions drawn about the nucleation of bacterial colonies and the propagation of biofilms over the complicated topography of most coral species. In contrast, sparse imaging results in near zero beam induced movement, preserving the sensitive structure of loosely nucleated bacteria on the coral surface. Cross correlation coefficients for a sequence of captured images quantitatively show the reduction of self-similarity due to beam induced movement for the fully sampled image, while the similarity of multiple captures is preserved for sparse imaging.

Once a high-quality images have been generated, it may be beneficial to determine the resolution of the reconstructed images. With typical scanning electron microscopes, the resolution of an image is determined both by the size of the probe (which is convoluted with the sample) and the division of the captured signal into pixels. If this division occurs at a high rate the image is stored with a high pixel count. Thus, the resolution may either be: 1) a circumstance in which the pixel size is larger than the probe, meaning the resolution of a well aligned image is generally the pixel size; or 3) if the pixel size is smaller than the probe size, the resolution is described in terms of the physical dimensions of the probe, due to the convolutional nature of electron imaging.

In the case where the pixel size is considerably larger than the probe size (generally at least one order of magnitude), it may not be correct to assume the resolution is exactly the pixel size, as two features directly adjacent may not be rationally distinguishable if one the adjacent features is completely un-sampled. Thus, the system functions based on the understanding that the resolution of sparse images may be somewhat larger than for traditionally fully sampled images, wherein most high-resolution features are preserved.

Figure 8A:
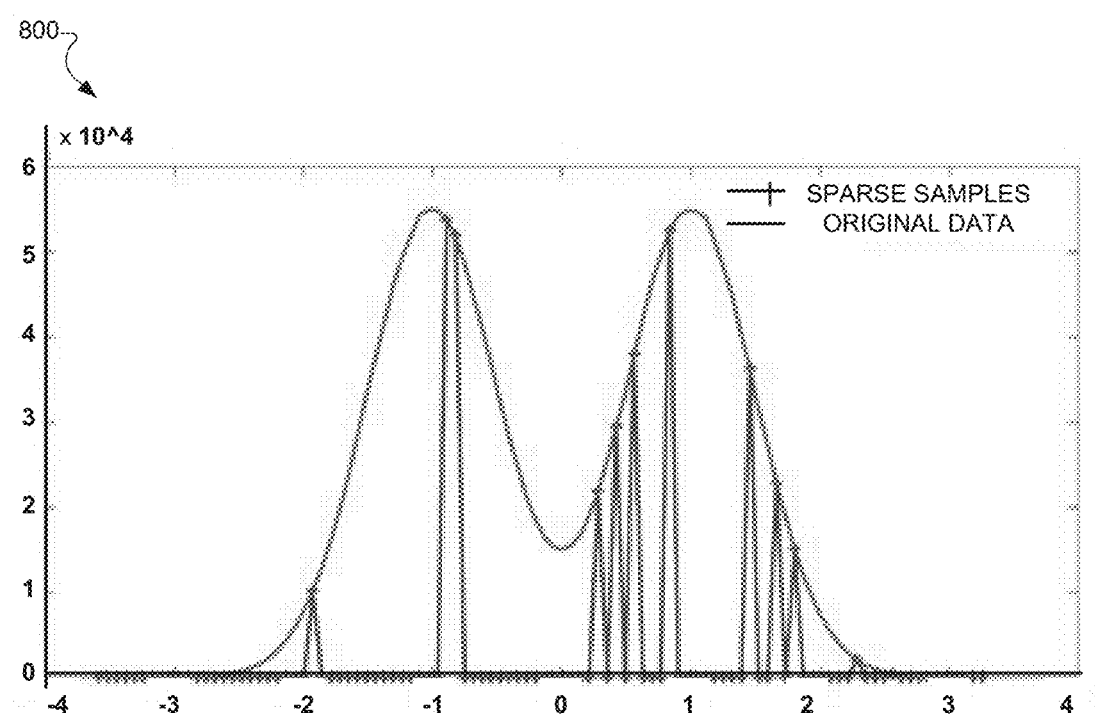

FIGS. 8A-8C illustrates and example method for evaluating the experimental resolution of sparse image, where many classical measures of resolution fail. In the chart 800 of FIG. 8A, two independent Gaussian distributions with slight overlap plotted with every point sampled (red) and only 15% of the points nonzero (blue), simulating random sampling. The two original distributions are not clearly distinguishable from the raw data, signaling the need for alternative metrics of image resolution. FIG. 8B illustrates a fully sampled image of yeast cells on cork (1024×1024 pixels) and FIG. 8C illustrates a sparse reconstruction with 15% of the pixels sampled. FIG. 8D illustrate the Fourier Shell Correlation plot 820 of the ground truth and reconstructed images showing a high degree of similarity out to very high spatial frequencies. Most notably, the FSC never actually drops to zero signaling preservation of 50% of the highest possible frequencies in the image.

Classically, the Rayleigh criterion of resolution is used as an imaging system's ability to distinguish these separate features. In the case of the fully sampled plot, it is clearly two independent distributions, but no effective corollary to the Rayleigh criterion for the raw spare data can be drawn. Since the reconstruction techniques described above do not add any new information—it simply it exploits other redundant information sampled in other parts of the image—applying the Rayleigh criterion to a reconstructed image may not give an accurate picture of the true experimental resolution of a sparse image.

In some embodiments, the disclosed reconstruction system 108 automatically applies a Fourier Shell/Ring Correlation, which calculates the correlation between two datasets in Fourier Space as a function of spatial frequency. More specifically, the system obtains a fully sampled and sparsely sampled image on a non-dose sensitive material and perform reconstructions as usual. A 2-D Fourier transform is applied to both the fully sampled image and the reconstruction. These Fourier spaces are converted to polar coordinates and rings as a function of radius extracted and their correlation coefficient calculated. The radius in terms of spatial frequency at which the ground truth and reconstructed images are no longer statistically significantly correlated is taken as the resolution of the image.

$$FSC(r) = \frac{\sum_{r_i \in r} F_1(r_i) \cdot F_2(r_i)^*}{\sqrt{\sum_{r_i \in r} |F_1(r_i)|^2 \cdot \sum_{r_i \in r} F_2(r_i)^2}}. \quad \text{Eq 1}$$

Equation 1 (Eq 1.) displays the formula for calculating the Fourier Shell Correlation (FSC). Typically, the cut off value of 0.5, ie 50% correlation, is used to determine the resolution from an FSC plot. In the case of our experimental fully sampled image (B.) and reconstructed sparse image with 15% random sampling (C.) of yeast cells on cork we determine that the cutoff value was approximately 20 nanometers, while the original resolution of the fully sampled image was approximately 12 nanometers. To achieve 15% of the total area electron dose, a traditionally fully sampled image would have to be coarsely sampled at approximately 400 by 400 pixels which would result in a final pixel size of approximately 30 nanometers. Thus, sparse imaging offers a much higher resolution alternative to traditional methods of reducing electron dose.

Figure 9:
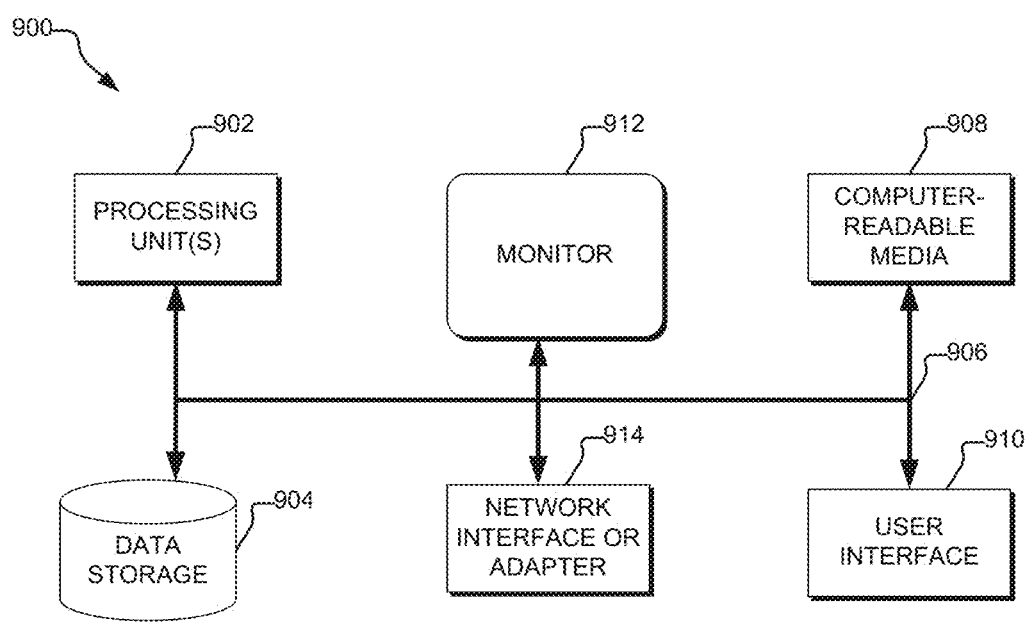
FIG. 9 is a block diagram illustrating a computing device reconstructing images generated from information sampled in intentionally under-sampled forms, according to aspects of the present disclosure.

FIG. 9 illustrates an example of a suitable computing and networking environment 900 that may be used to implement various aspects of the present disclosure described in FIGS. 1-3 and particularly the data reconstruction system 908. As illustrated, the computing and networking environment 900 includes a general purpose computing device 900, although it is contemplated that the networking environment 900 may include one or more other computing systems, such as personal computers, server computers, hand-held or laptop devices, tablet devices, multiprocessor systems, microprocessor-based systems, set top boxes, programmable consumer electronic devices, network PCs, minicomputers, mainframe computers, digital signal processors, state machines, logic circuitries, distributed computing environments that include any of the above computing systems or devices, and the like.

Components of the computer 900 may include various hardware components, such as a processing unit 902, a data storage 904 (e.g., a system memory), and a system bus 906 that couples various system components of the computer 900 to the processing unit 902. The system bus 906 may be any of several types of bus structures including a memory bus or memory controller, a peripheral bus, and a local bus using any of a variety of bus architectures. For example, such architectures may include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 900 may further include a variety of computer-readable media 908 that includes removable/non-removable media and volatile/nonvolatile media, but excludes transitory propagated signals. Computer-readable media 908 may also include computer storage media and communication media. Computer storage media includes removable/non-removable media and volatile/nonvolatile media implemented in any method or technology for storage of information, such as computer-readable instructions, data structures, program modules or other data, such as RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information/data and which may be accessed by the computer 900. Communication media includes computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. For example, communication media may include wired media such as a wired network or direct-wired connection and wireless media such as acoustic, RF, infrared, and/or other wireless media, or some combination thereof. Computer-readable media may be embodied as a computer program product, such as software stored on computer storage media.

The data storage or system memory 904 includes computer storage media in the form of volatile/nonvolatile memory such as read only memory (ROM) and random access memory (RAM). A basic input/output system (BIOS), containing the basic routines that help to transfer information between elements within the computer 900 (e.g., during start-up) is typically stored in ROM. RAM typically contains data and/or program modules that are immediately accessible to and/or presently being operated on by processing unit 902. For example, in one embodiment, data storage 904 holds an operating system, application programs, and other program modules and program data.

Data storage 904 may also include other removable/non-removable, volatile/nonvolatile computer storage media. For example, data storage 904 may be: a hard disk drive that reads from or writes to non-removable, nonvolatile magnetic media; a magnetic disk drive that reads from or writes to a removable, nonvolatile magnetic disk; and/or an optical disk drive that reads from or writes to a removable, nonvolatile optical disk such as a CD-ROM or other optical media. Other removable/non-removable, volatile/nonvolatile computer storage media may include magnetic tape cassettes, flash memory cards, digital versatile disks, digital video tape, solid state RAM, solid state ROM, and the like. The drives and their associated computer storage media, described above and illustrated in FIG. 9, provide storage of computer-readable instructions, data structures, program modules and other data for the computer 900.

A user may enter commands and information through a user interface 910 or other input devices such as a tablet, electronic digitizer, a microphone, keyboard, and/or pointing device, commonly referred to as mouse, trackball or touch pad. Other input devices may include a joystick, game pad, satellite dish, scanner, or the like. Additionally, voice inputs, gesture inputs (e.g., via hands or fingers), or other natural user interfaces may also be used with the appropriate input devices, such as a microphone, camera, tablet, touch pad, glove, or other sensor. These and other input devices are often connected to the processing unit 902 through a user interface 910 that is coupled to the system bus 906, but may be connected by other interface and bus structures, such as a parallel port, game port or a universal serial bus (USB). A monitor 912 or other type of display device is also connected to the system bus 906 via an interface, such as a video interface. The monitor 912 may also be integrated with a touch-screen panel or the like.

The computer 900 may operate in a networked or cloud-computing environment using logical connections of a network interface or adapter 914 to one or more remote devices, such as a remote computer. The remote computer may be a personal computer, a server, a router, a network PC, a peer device or other common network node, and typically includes many or all of the elements described above relative to the computer 900. The logical connections depicted in FIG. 9 include one or more local area networks (LAN) and one or more wide area networks (WAN), but may also include other networks. Such networking environments are commonplace in offices, enterprise-wide computer networks, intranets and the Internet.

When used in a networked or cloud-computing environment, the computer 900 may be connected to a public and/or private network through the network interface or adapter 914. In such embodiments, a modem or other means for establishing communications over the network is connected to the system bus 906 via the network interface or adapter 914 or other appropriate mechanism. A wireless networking component including an interface and antenna may be coupled through a suitable device such as an access point or peer computer to a network. In a networked environment, program modules depicted relative to the computer 900, or portions thereof, may be stored in the remote memory storage device.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the disclosure and are thus within the spirit and scope of the present disclosure. From the above description and drawings, it will be understood by those of ordinary skill in the art that the particular embodiments shown and described are for purposes of illustrations only and are not intended to limit the scope of the present disclosure. References to details of particular embodiments are not intended to limit the scope of the disclosure.

What is claimed is:

1. A system for reconstructing images comprising:
    a measurement system configured to capture at least one image corresponding to a sample specimen, wherein the measurement system includes a high-speed electrostatic beam blanker that includes a deflector that blocks an electron beam, which prevents portions of the sample specimen from being imaged such that portions of the at least one image are missing due to intentional under-sampling of the sample specimen, and wherein the measurement system is configured to control the high-speed electrostatic beam blanker to intentionally under-sample the sample specimen based on a pre-defined percentage-of-pixel value and a pre-defined dwell time; and
    a processing device, in operable communication with the measurement system, to automatically restore the missing portions of the at least one image, wherein the processing device is configured to:
    access a learned dictionary to identify latent features of the at least one image;
    identify linear combinations of the latent features identified from the learned dictionary; and
    reconstruct the missing portions of the at least one image according to the one or more linear combinations.

2. The system of claim 1, wherein the measurement system is a scanning electron microscope configured to generate the electron beam to illuminate the sample specimen to generate the at least one image.

3. The system of claim 1, wherein intentionally under-sampling the sample specimen reduces the amount of damage to the specific sample specimen during capture of the at least one image.

4. The system of claim 1, wherein the processing device is further configured to evaluate the resolution of the at least one image after being reconstructed.

5. The system of claim 1, wherein the sample specimen is at least one of a one-dimensional signal, a two-dimensional image, and a three-dimensional structure.

6. The system of claim 1, wherein the measurement system is configured to apply a random sampling pattern with unfair coin toss to the sample specimen to identify specific pixels of the sample specimen that are to be imaged to satisfy the pre-defined percentage-of-pixel value.

7. A method for reconstructing images comprising:
capturing, using a measurement system, at least one image corresponding to a sample specimen, wherein the capturing includes using a high-speed electrostatic beam blanker that includes a deflector to block an electrostatic beam, which prevents portions of the sample specimen from being imaged such that portions of the at least one image are missing due to intentional under-sampling of the sample specimen, and wherein the capturing includes controlling the high-speed electrostatic beam blanker to intentionally under-sample the sample specimen based on a pre-defined percentage-of-pixel value and a pre-defined dwell time; and
automatically restoring, using a processing device, the missing portions of the at least one image by:
accessing a learned dictionary to identify latent features of the at least one image;
identifying linear combinations of the latent features that were identified from the learned dictionary; and
reconstructing the missing portions of the at least one image according to the one or more linear combinations.

8. The method of claim 7, wherein the measurement system is a scanning electron microscope configured to generate the electron beam to illuminate the sample specimen, thereby generating the at least one image.

9. The method of claim 7, wherein intentionally under-sampling the sample specimen reduces the amount of damage to the specific sample specimen during the capturing of the at least one image.

10. The method of claim 7, further comprising evaluating the resolution of the at least one image after being reconstructed.

11. The method of claim 7, wherein the sample specimen is at least one of a one-dimensional signal, a two-dimensional image, and a three-dimensional structure.

12. A non-transitory computer readable medium encoded with instructions for reconstructing images, the instructions, executable by a processing device, comprising:
capturing, at a measurement system, at least one image corresponding to a sample specimen, wherein the capturing includes using a high-speed electrostatic beam blanker that includes a deflector to block an electrostatic beam, which prevents portions of the sample specimen from being imaged such that portions of the at least one image are missing due to intentional under-sampling of the sample specimen, and wherein the capturing includes controlling the high-speed electrostatic beam blanker to intentionally under-sample the sample specimen based on a pre-defined percentage-of-pixel value and a pre-defined dwell time; and
automatically restoring, using the processing device, the missing portions of the at least one image by:
accessing a learned dictionary to identify latent features of the at least one image;
identifying linear combinations of the latent features identified from the learned dictionary; and
reconstructing the missing portions of the at least one image according to the one or more linear combinations.

13. The non-transitory computer readable medium of claim 12, wherein the measurement system is a scanning electron microscope configured to generate the electron beam to illuminate the sample specimen to generate the at least one image.

14. The non-transitory computer readable medium of claim 12, wherein intentionally under-sampling the sample specimen reduces the amount of damage to the specific sample specimen during the capturing of the at least one image.

15. The non-transitory computer readable medium of claim 12, further comprising evaluating the resolution of the at least one image after being reconstructed.

16. The non-transitory computer readable medium of claim 12, wherein the sample specimen is at least one of a one-dimensional signal, a two-dimensional image, and a three-dimensional structure.

* * * * *